(12) United States Patent
Ando et al.

(10) Patent No.: US 8,488,283 B2
(45) Date of Patent: Jul. 16, 2013

(54) LOAD DRIVE DEVICE

(75) Inventors: Motohiro Ando, Kyoto (JP); Akio Sasabe, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 429 days.

(21) Appl. No.: 12/874,423

(22) Filed: Sep. 2, 2010

(65) Prior Publication Data

US 2011/0051296 A1  Mar. 3, 2011

(30) Foreign Application Priority Data

Sep. 3, 2009 (JP) ................................ 2009-203592

(51) Int. Cl.
*H02H 9/02* (2006.01)
(52) U.S. Cl.
USPC ............................................................ 361/18
(58) Field of Classification Search
USPC ............................................ 361/139, 190, 18
See application file for complete search history.

(56) References Cited

U.S. PATENT DOCUMENTS

| | | | | |
|---|---|---|---|---|
| 4,178,620 A * | 12/1979 | Yu | ................................... | 361/98 |
| 5,323,258 A * | 6/1994 | Tsushima et al. | ............. | 398/203 |
| 5,781,390 A * | 7/1998 | Notaro et al. | .................... | 361/84 |
| 6,654,262 B2 * | 11/2003 | Hussein et al. | .................. | 363/49 |
| 6,831,433 B2 * | 12/2004 | Furui | .............................. | 318/432 |
| 7,369,385 B2 * | 5/2008 | Brennan et al. | .............. | 361/93.1 |
| 7,385,375 B2 * | 6/2008 | Rozman | ......................... | 323/224 |
| 7,948,809 B2 * | 5/2011 | Miki | ......................... | 365/189.09 |

FOREIGN PATENT DOCUMENTS

| | | |
|---|---|---|
| JP | 04-002209 | 1/1992 |
| JP | 2006-229864 | 8/2006 |

* cited by examiner

*Primary Examiner* — Stephen W Jackson
*Assistant Examiner* — Angela Brooks
(74) *Attorney, Agent, or Firm* — Fish & Richardson P.C.

(57) ABSTRACT

The load drive device of the present invention comprises a load drive unit for switching on/off output current that flows to an inductive load; and an overcurrent protection circuit for detecting whether the output current is in an overcurrent state, wherein the load drive unit has an output transistor connected to one end of the inductive load; and a pre-driver for generating a control signal of the output transistor in accordance with an input signal, and the pre-driver has a first drive unit for switching on/off the output transistor during normal operation; and a second drive unit for switching off the output transistor more slowly than the first drive unit during overcurrent protection operation.

19 Claims, 21 Drawing Sheets

FIG. 2

| TERMINAL NUMBER | TERMNAL NAME | FUNCTION | TERMINAL NUMBER | TERMNAL NAME | FUNCTION |
|---|---|---|---|---|---|
| 1 | GND | GROUND TERMINAL | 13 | VCC | POWER SOURCE TERMINAL |
| 2 | FAULT | ABNORMAL DETECTION SIGNAL OUTPUT TERMINAL | 14 | VCC | POWER SOURCE TERMINAL |
| 3 | TEST | TEST TERMINAL (USING GND CONNECTION) | 15 | OUT1 | FET DRAIN OUTPUT TERMINAL |
| 4 | NC | NON-CONNECTION | 16 | PGND | POWER GROUND TERMINAL |
| 5 | IN1 | FET CONTROL INPUT TERMINAL | 17 | PGND | POWER GROUND TERMINAL |
| 6 | IN2 | FET CONTROL INPUT TERMINAL | 18 | OUT2 | FET DRAIN OUTPUT TERMINAL |
| 7 | IN3 | FET CONTROL INPUT TERMINAL | 19 | OUT3 | FET DRAIN OUTPUT TERMINAL |
| 8 | IN4 | FET CONTROL INPUT TERMINAL | 20 | PGND | POWER GROUND TERMINAL |
| 9 | ENABLE | ENABLE TERMINAL | 21 | PGND | POWER GROUND TERMINAL |
| 10 | NC | NON-CONNECTION | 22 | OUT4 | FET DRAIN OUTPUT TERMINAL |
| 11 | NC | NON-CONNECTION | 23 | VCC | POWER SOURCE TERMINAL |
| 12 | NC | NON-CONNECTION | 24 | VCC | POWER SOURCE TERMINAL |

FIG. 4

| ITEM | SYMBOL | SPECIFIED VALUE | UNIT | CONDITION |
|---|---|---|---|---|
| OVERALL | | | | |
| CIRCUIT CURRENT 1 | $I_{CC1}$ | max 2.5 | mA | ENABLE=L |
| CIRCUIT CURRENT 2 | $I_{CC2}$ | max 5.0 | mA | ENABLE=H |
| CONTROL INPUT (IN1,IN2,IN3,IN4,ENABLE) | | | | |
| H LEVEL INPUT VOLTAGE | $V_{INH}$ | min 2.0 | V | |
| L LEVEL INPUT VOLTAGE | $V_{INL}$ | max 0.8 | V | |
| H LEVEL INPUT CURRENT | $I_{INH}$ | 50 | µA | $V_{IN}=5V$ |
| L LEVEL INPUT CURRENT | $I_{INL}$ | 0 | µA | $V_{IN}=0V$ |
| FAULT OUTPUT | | | | |
| OUTPUT L VOLTAGE | $V_{FAULT}$ | 50 | mV | $I_{FAULT}=1mA$ |
| OUTPUT LEAK CURRENT | $I_{FAULT\_LEAK}$ | max 10 | µA | $V_{FAULT}=7V$ |
| OUTPUT(OUT1,OUT2,OUT3,OUT4) | | | | |
| OUTPUT ON RESISTOR | $R_{ON}$ | 1.2 | Ω | $I_{OUT}=0.5A$ |
| OUTPUT LEAK CURRENT | $I_{LEAK}$ | max 10 | µA | |
| CLAMP DIODE FORWARD VOLTAGE | $V_F$ | 1.0 | V | $I_F=0.5A$ |
| CLAMP DIODE REVERSE VOLTAGE | $I_R$ | max 10 | µA | |
| TURN-ON TIME | $t_{ON}$ | 30 | ns | $C_L=15pF$, $R_L=150Ω$ |
| TURN-OFF TIME | $t_{OFF}$ | 150 | ns | $C_L=15pF$, $R_L=150Ω$ |

US 8,488,283 B2

LOAD DRIVE DEVICE

CROSS-REFERENCE TO RELATED APPLICATIONS

The present application is based on the following Japanese Application.
(1.) Japanese Laid-open Patent Application No. 2009-203592 (Application Date: Sep. 3, 2009)

BACKGROUND OF THE INVENTION

1. Field of the Invention

The present invention relates to a load drive device for controlling the driving of a load.

2. Description of Related Art

<First Background Art>

FIG. 17 is a view showing a first conventional example of a load drive device. The load drive device 100 shown in FIG. 17 is a semiconductor integrated circuit device provided with an output transistor 101 as switching means for driving a load 200 connected to an output terminal OUT.

A connection detection circuit 400 for detecting whether a load 200 is connected to the load drive device 100 and outputting a detection signal DET to a CPU 300 is formed by a discrete component in a set equipped with the load drive device 100 of prior art.

The connection detection circuit 400 is configured to divide a voltage Va that appears at one end of the load 200 using a resistor 401 and a resistor 402 to generate a divided voltage Vb, and to generate a connection detection signal DET by presenting the divided voltage to a logic gate 403 (a buffer or the like) in order to detect a connection between the load drive device 100 and the load 200, in a state in which an output transistor 101 housed in the load drive device 100 has been switched on.

Specifically, if the load 200 is connected to a semiconductor device 100, the connection detection signal DET is a low level because the voltage Va is brought down to nearly ground potential (GND) via the output transistor 101, which has been switched on. On the other hand, if the load 200 is not connected to a semiconductor device 100, the connection detection signal DET is a high level because the voltage Va is brought up to nearly power source voltage (VCC) via the output transistor 200. Therefore, the CPU 300 can recognize whether the load 200 is connected to the semiconductor device 100 by monitoring the detection signal DET.

Japanese Laid-open Patent Application No. 4-2209 is an example of prior art related to the first background art.

<Second Background Art>

FIG. 18 is a view showing a second conventional example of a load drive device and FIG. 19 is a timing chart showing an operation example of the load drive device shown in FIG. 18. During normal operation of the load drive device 100 (when a later-described overcurrent protection signal Sb is a low level), the input signal SA inputted to an input terminal IN is inputted to a pre-driver 102 via a Schmitt buffer 103 and a logic AND arithmetic unit 106. Here, when the input signal SA is a high level, a gate signal SB of the output transistor 101 is set at a high level, the output transistor 101 is switched on, and the output voltage VOUT that appears at the output terminal OUT is brought down to a low level (near ground potential (GND)). Conversely, when the input signal SA is a low level, the gate signal SB of the output transistor 101 is set at a low level, the output transistor 101 is switched off, and the output voltage VOUT that appears at the output terminal OUT is brought up to a high level (near power source potential (VCC)).

On the other hand, when the output current IOUT that flows to the load 200 reaches a predetermined threshold, the overcurrent protection circuit 104 detects that the output current IOUT is in an overcurrent state and sets the overcurrent detection signal SA from a low level to a high level. A mask time generation circuit 105 sets the overcurrent protection signal Sb from a low level to a high level when the overcurrent detection signal Sa has been kept at a high level over a predetermined mask time Tm. The logic AND arithmetic unit 106 outputs to the pre-driver 102 the logic AND signal of the input signal SA inputted to a non-inverted input terminal and the overcurrent protection signal Sb inputted to an inverted input terminal. Specifically, when the overcurrent protection signal Sb is a high level, the input signal (the output signal of the logic AND arithmetic unit 106) of the pre-driver 102 does not depend on the logic level of the input signal SA and is constantly a low level, the gate signal SB of the output transistor 101 is forcibly set to a low level, and the output transistor 101 is forcibly switched off.

Japanese Laid-open Patent Application No. 2006-229864 is an example of prior art related to the second background art.

SUMMARY OF THE INVENTION

First Problem

As noted above, with the load drive device 100 shown in FIG. 17, the output transistor 101 housed in the load drive device 100 must be switched on in order to detect whether the load 200 is connected to the load drive device 100. Accordingly, the load 200 is driven during initialization diagnostics of the set, and a mechanical contrivance on the set is required.

For example, in a set equipped with a solenoid for driving a clutch member and a coil of a motor for causing a gear member to rotate as the load 200, some countermeasure must be taken so that mechanical obstruction relating to the member (such as contact, interference, deformation, or destruction) do not arise in the set, because the clutch member and the gear member are unnecessarily driven when the output transistor 101 is switched on and the output current LOUT flows to the load 200 in order to detect whether the load 200 is connected to the load drive device 100.

In the case that an inductive load (coil, or the like) is connected as the load 200, a counter voltage is generated in the load 200 and the voltage Va that appears at one end of the load 200 rapidly increases when the detection of the load 200 connection is ended and the output transistor 101 is switched off. For this reason, depending on the divided voltage ratio (the resistance ratio of the resistor 401 and resistor 402) of a voltage-dividing circuit, the voltage level of the divided voltage Vb may exceed the withstand voltage of the logic gate 403, and the logic gate 403 may be destroyed.

Also, as noted above, the connection detection circuit 400 for detecting the connection of the load 200 is formed as a discrete component on the substrate of the set, leading to a larger set (an increase in the number of components) and higher costs.

Since the output transistor 101 is switched on and off during normal operation of the load drive device 100, it is not possible for the connection detection circuit 400 to detect the connection of a load 200.

Second Problem

The load drive device 100 shown in FIG. 18 is configured so as to dually use the single pre-driver 102 as a circuit for switching the output transistor 101 on and off during normal operation and as a circuit for forcibly switching off the output transistor 101 during overcurrent protection operation.

The pre-driver 102 is designed so that the on/off switching speed of the output transistor 101 (i.e., the through rate of the gate signal SB) is rapid in order to reduce switching loss during normal operation. For this reason, a counter voltage to the load 200 is generated when the output transistor 101 is off and an output voltage VOUT that is higher than the power source voltage VCC is applied to the output transistor 101.

As shall be apparent, the output transistor 101 is designed so that the output voltage VOUT applied thereto does not exceed the withstand voltage when the counter voltage is generated during normal operation. However, the output voltage VOUT applied to the output transistor 101 is liable to exceed the withstand voltage and destroy the output transistor 101 because a counter voltage that is far greater than the counter voltage generated during normal operation is generated when the output transistor 101 is rapidly shut off in a state in which an excessively high output current IOUT is flowing to the load 200, such as during overcurrent protection operation (see FIG. 19).

The present invention was contrived in view of the above problems encountered by the present inventors, and an object thereof is to provide a load drive device that can reduce switching loss during normal operation and protect the output transistor during overcurrent protection operation.

In order to achieve the objects described above, the load drive device of the present invention comprises a load drive unit for switching on/off an output current that flows to an inductive load; and an overcurrent protection circuit for detecting whether the output current is in an overcurrent state, wherein the load drive unit has an output transistor connected to one end of the inductive load; and a pre-driver for generating a control signal of the output transistor in accordance with an input signal, and the pre-driver has a first drive unit for switching on/off the output transistor during normal operation; and a second drive unit for switching off the output transistor more slowly than the first drive unit during overcurrent protection operation.

Other features, elements, steps, advantages, and characteristics will be further revealed by the detailed description of the best mode that follows below and the drawings related thereto.

BRIEF DESCRIPTION OF THE DRAWINGS

FIG. 2 is a function table of the external terminals;

FIG. 4 is a table showing the electrical characteristics of the present IC1;

DETAILED DESCRIPTION OF PREFERRED EMBODIMENTS

Block Diagram

Figure 1:
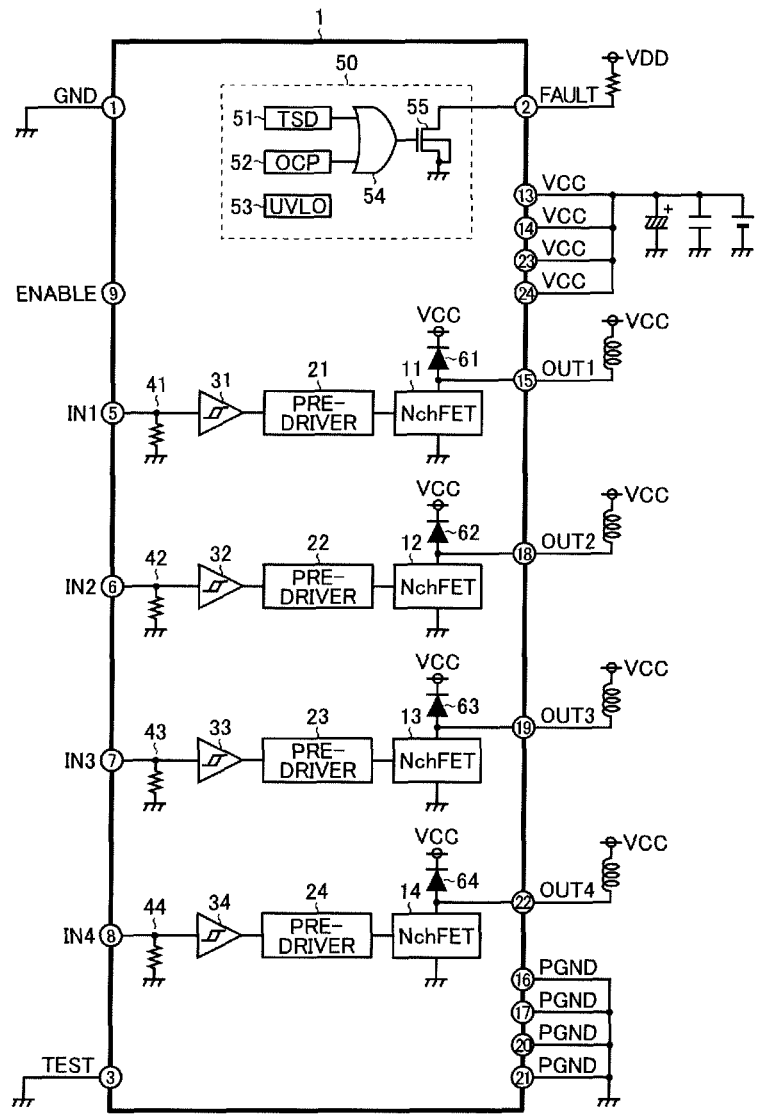
FIG. 1 is a block diagram schematically showing the internal configuration of the semiconductor integrated circuit device of the present invention.

FIG. 1 is a block diagram schematically showing the internal configuration of the semiconductor integrated circuit device ("the present IC") of the present invention. As shown in FIG. 1, the present IC1 is composed of n-channel DMOS (double diffused metal oxide semiconductor) field-effect transistors 11 to 14, pre-drivers 21 to 24, Schmitt buffers 31 to 34, pulldown resistors 41 to 44, an abnormal protection circuit 50, and clamp diodes 61 to 64. The abnormal protection circuit 50 includes a temperature protection circuit 51, an overcurrent protection circuit 52, an under-voltage lockout circuit 53, a logic OR arithmetic unit 54, and an n-channel MOS field-effect transistor 55. The present IC1 has 24 external terminals (pins 1 through 24) as means for establishing an electrical connection with the exterior of the device. The present IC1 is generally referred to as an IPS (intelligent power switch), an SMOS (smart MOS), or IPD (intelligent power device).

<External Terminals>

FIG. 2 is a function table of the external terminals. Pin 1 (GND) is a ground terminal, as shown in FIG. 2. Pin 2 (FAULT) is an abnormal detection signal output terminal. Pin 3 (TEST) is a test terminal (used by GND connection). Pin 4, and pins 10 through 12 (NC) are non-connection terminals.

Pins 5 through 8 (IN1 to IN4) are control input terminals of FET11 through FET14, respectively. Pin 9 (ENABLE) is an enable terminal. Pins 13, 14, 23, and 24 (VCC) are power source terminals. Pins 15, 18, 19, and 22 (OUT1 to OUT4) are drain output terminals of FET11 through FET14, respectively. Pins 16, 17, 20, and 21 (PGND) are power ground terminals.

<I/O Equivalent Circuit>

Figure 3A:
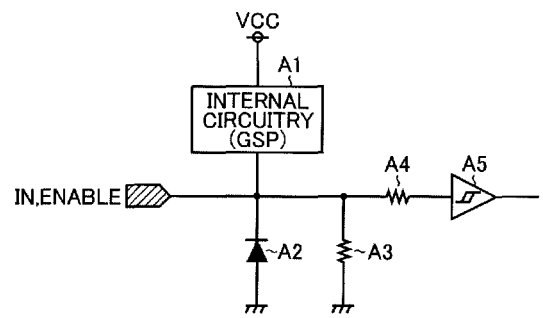
FIG. 3A is an I/O equivalent circuit diagram of the present IC1 (IN/ENABLE)
Figure 3B:
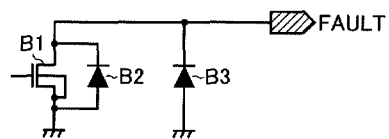
FIG. 3B is an I/O equivalent circuit diagram of the present IC1 (FAULT)
Figure 3C:
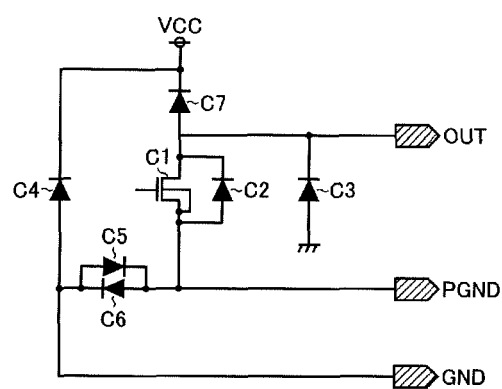
FIG. 3C is an I/O equivalent circuit diagram of the present IC1 (OUT/VCC/GND/PGND)

FIGS. 3A, 3B, and 3C are diagrams showing I/O input equivalent circuits of the present IC1. FIG. 3A shows the input equivalent circuit of the pins 5 through 8 (IN1 to IN4), and pin 9 (ENABLE). In FIG. 3A, reference numeral A1 is an internal circuit (ghost supply malfunction prevention circuit), reference numeral A2 is an electrostatic protection diode, reference numerals A3 and A4 are resistances, and reference numeral A5 is a Schmitt buffer. FIG. 3B shows the output equivalent circuit of pin 2 (FAULT). In FIG. 3B, the reference numeral B1 is an n-channel MOS field-effect transistor, reference numeral B2 is a parasitic diode, and reference numeral B3 is an electrostatic protection diode. FIG. 3C shows the I/O equivalent circuit of pin 1 (GND), and pins 13 through 24 (VCC, OUT1 to OUT4, and PGND). In FIG. 3C, the reference numeral C1 is an n-channel DMOS field-effect transistor, reference numeral C2 is a parasitic diode, reference numerals C3 to C6 are electrostatic diodes, and reference numeral C7 is a clamp diode.

<Electrical Characteristics>

FIG. 4 is a table showing the electrical characteristics of the present IC1. Unless otherwise specified, the definitive values in the table are values obtained with an ambient temperature Ta of 25° C. and a power source Vcc of 24 V.

<General Overview>

Next, a general overview of the present IC1 will be described. The present IC1 is a low-side switch (sink driver) that houses four n-channel DMOS field-effect transistor circuits (see reference numerals 11 through 14 of FIG. 1). The present IC1 is equipped with various protection functions (see reference numeral 50 of FIG. 1) and is ideal as drive means for a solenoid and a DC brush motor, and as constant-voltage drive means for a unipolar stepping motor. The present IC1 also houses a clamp diode for absorbing counter electromotive force generated during inductive load driving (see reference numeral C7 of FIG. 3C).

<Characteristics>

Next, the characteristics of the present IC1 will be described. A first characteristic is that the power source voltage rating is 36 V. A second characteristic is that the output current rating is 1.0 A. A third characteristic is that the inclusion of four n-channel DMOS field-effect transistor circuits (see reference numerals 11 through 14 of FIG. 1). A fourth characteristic is the inclusion of a clamp diode for absorbing counter electromotive force (see reference numerals 61 to 64 of FIG. 1, and the reference numeral C7 of FIG. 3C). A fifth characteristic is that direct driving is possible from CMOS (complementary MOS) logic and TTL (transistor-transistor logic) logic. A sixth characteristic is the inclusion of a logic-input pulldown resistor (see reference numerals 41 through 44 of FIG. 1, and reference numeral A3 of FIG. 3A). A seventh characteristic is that an output function (for wired OR) for an abnormal detection signal is provided (see reference numeral 50 of FIG. 1). An eighth characteristic is the inclusion of a temperature protection circuit (TSD (thermal shut down; see reference numeral 51 of FIG. 1). An ninth characteristic is the inclusion of an overcurrent protection (OCP) circuit (see reference numeral 52 of FIG. 1). A tenth characteristic is the inclusion of an under-voltage lockout (UVLO) circuit (see reference numeral 53 of FIG. 1). An eleventh characteristic is the inclusion of a ghost supply malfunction prevention (GSP) circuit (see reference numeral A1 of FIG. 3A). A twelfth characteristic is that an adjacent pin short-circuit prevention function is provided. A thirteenth characteristic is that an ultra-small, ultra-thin, high heat-emission (reverse surface heat emission type) package is employed.

<Application>

The present IC1 is advantageous for use in solenoid drives, DC brush motor drives, unipolar stepping motor drives, and the like in a PPC (plain paper copier), MFP (multifunction peripheral), and other OA equipment.

<Detailed Description of the External Terminals and Notes about the Substrate Layout>

Next, a detailed description of the external terminals and notes about the substrate layout will be provided.

(IN1, IN2, IN3, IN4/FET Control Input Terminals)

Pins 5 to 8 (IN1 to IN4) are control input terminals of FET11 to FET14, respectively; and FET11 to F14 are switched on/off (i.e., the logic level of output signals) in accordance with the logic level of the input signal inputted to each pin. Specifically, when the logic level of the input signal inputted to each pin is a low level, the FET of the corresponding pin is switched off and the logic level of the output signal outputted from the drain is set in an open state. Conversely, when the logic level of the input signal inputted to each pin is a high level, the FET of the corresponding pin is switched on and the logic level of the output signal outputted from the drain is set to a low level. Pins 5 to 8 (IN1 to IN4) can accept direct input from CMOS logic and TTL logic. In such a case, it is preferred that the high-level input voltage be 2.0 V or higher, and that the low level input voltage be 0.8 V or lower. As described above, pins 5 to 8 (IN1 to IN4) include pulldown resistors (100 kΩ) in order to prevent malfunction when input is open (see reference numerals 41 to 44) of FIG. 1, or reference numeral A3 of FIG. 3A).

(ENABLE/Power Save Terminal)

Pin 9 (ENABLE) is an enable terminal and is capable of setting the output of all FET11 to FET14 in an open state (off) in accordance with the logic level of the input signal inputted to the enable terminal. More specifically, the FET11 to FET14 are set in an inactive state (off state) when the logic level of the input signal inputted to pin 9 (ENABLE) is a low level. Conversely, the FET11 to FET14 are set in an active state (operable state) when the logic level of the input signal inputted to pin 9 (ENABLE) is a high level. However, it should be noted that when the input signal inputted to pin 9 (ENABLE) is switched from a low level to a high level, there is a maximum delay of 40 µs until the FET11 to FET14 return from an inactive state to an active state. Pin 9 (ENABLE) can accept direct input from CMOS logic and TTL logic in the same manner as pins 5 to 8 (IN1 to IN4). In such a case, it is preferred that the high-level input voltage be 2.0 V or higher, and that the low level input voltage be 0.8 V or lower. As described above, pin 9 (ENABLE) includes a pulldown resistor (100 kW in the same manner as pins 5 to 8 (IN1 to IN4) in order to prevent malfunction when input is open (see reference numeral A3 of FIG. 3A).

(TEST/Test Terminal)

Pin 3 (TEST) is a test terminal, and pin 3 is preferably connected to GND during actual use of the present IC1. It should be noted that a malfunction can occur when the present IC1 is used without connecting pin 3 to GND.

(VCC/Power Source Terminal)

Pins 13, 14, 23, and 24 (VCC) are power source terminals. Since a load drive current flows to these external terminals, the wiring connected to the terminals is preferably thick, short, low-impedance wiring. Since it is possible that the VCC voltage will fluctuate considerably due to counter electromotive force or the like, it is preferred that an electrolytic capacitor or another bypass capacitor (10 µF to 470 µF) be disposed as near as possible to the terminal and adjusted so that the VCC voltage is stable. A layered ceramic capacitor or the like having a capacitance of about 0.01 µF to 0.1 µF is preferably arranged in series with the bypass capacitor in order to reduce the impedance of the power source in a wide frequency band. Care should be taken so that the VCC voltage does not exceed the rating even for a moment. The power source terminals are short-circuited inside the present IC1, and are preferably short-circuited externally as well. It should be noted that when the power source terminals are used without being externally short-circuited, convergence of current paths or the like may occur, and both malfunction and destruction are possible. Clamp elements for preventing electrostatic damage is housed in the power source terminals (see reference numerals C4 to C6 of FIG. 3C). When a surge or another rapid pulse signal or voltage that is equal to or greater than the absolute maximum rating is applied to the power source terminals, the clamp elements are liable to be actuated and destroyed, so it is important that the absolute maximum rating not be exceeded.

(PGND/Power Ground Terminals)

Pins 16, 17, 20, and 21 (PGND) are power ground terminals. Since a considerable current flows to these external terminals, it is preferred that the impedance of the wiring connected to the terminals be kept as low as possible, and that the pattern be designed so that there is no shared impedance with other GND patterns. It is important that the PGND terminals always be connected to ground.

(GND/Ground Terminals)

Pin 1 (GND) is a ground terminal. It is preferred that the impedance of the wiring connected to the terminal be kept as low as possible to achieve the lowest electric potential in any operating state in order to stabilize the internal reference voltage of the present IC1. It is also preferred that the pattern be designed so that there is no shared impedance with other GND patterns.

(OUT1, OUT2, OUT3, OUT4/FET Drain Output Terminals)

Pins 15, 18, 19, and 22 (OUT1 to OUT4) are drain output terminals of FET11 through FET14, respectively. Since a load drive current flows to these external terminals, the wiring connected to the terminals is preferably thick, short, low-impedance wiring. The present IC1 houses a counter electromotive force-absorbing clamp diode (see reference numerals 61 to 64 of FIG. 1, and reference numeral C7 of FIG. 3C), and at maximum, a voltage that corresponds to the forward voltage of the VCC voltage+the counter electromotive force-absorbing clamp diode is applied to these output terminals. For this reason, it is important that care be taken so this voltage does not exceed the absolute maximum rating. Each of these output terminals houses a clamp element for preventing electrostatic damage (see reference numeral C3 of FIG. 3C). When a surge or another rapid pulse signal or voltage that is equal to or greater than the absolute maximum rating is applied to the power source terminals, the clamp elements are liable to be actuated and destroyed, so it is important that the absolute maximum rating not be exceeded.

(FAULT/Abnormal Detection Signal Output Terminal)

Pin 2 (FAULT) is an abnormal detection signal output terminal. The abnormal protection circuit 50 outputs an abnormal detection signal from pin 2 when the temperature protection circuit 51 or the overcurrent protection circuit 52 has been actuated. More specifically, the logic level of the abnormal detection signal outputted from the FAULT terminal is a high level (FET55 is off) only when the temperature protection circuit 51 and the overcurrent protection circuit 52 are both in an inactive state (abnormality undetected state), and the logic level of the abnormal detection signal outputted from the FAULT terminal is a low level (FET55 is on) when either the temperature protection circuit 51 or the overcurrent protection circuit 52 at least is in an active state (abnormality detected state). On the other hand, the abnormal protection circuit 50 does not output an abnormal protection signal even when the under-voltage lockout circuit 53 has been actuated. Since the output format of pin 2 (FAULT) is an open drain format, the external terminals must be pulled up to the power source line at 7 V or less (e.g., 5 V or 3.3 V) using a pull-up resistance 5 kΩ to 10 kΩ.

(NC/Non-Connection Terminal)

Pin 4, and pins 10 through 12 (NC) are non-connection terminals and are therefore not electrically connected to the internal circuitry of the present IC1.

(IC Reverse Surface Metal)

The package used in the present IC1 has a heat-dissipating metal on the reverse side of the IC, and the present IC1 is based on being used for heat being dissipated to the reverse side metal. Therefore, it is preferred that the reverse side metal be connected with solder to the GND plane on the substrate, that the GND pattern be made as wide as possible, and that an adequate heat-dissipating surface area be provided. Care must be taken because a predetermined allowable dissipation cannot be assured when a soldered connection is not provided. Since the reverse-side metal is short-circuited with the chip reverse surface of the present IC1 and pin 1 (GND) and is at GND potential, malfunction and damage are possible when the reverse-side metal is short-circuited to a potential other than GND. For this reason, the reverse surface of the present IC1 must not be wired through a wiring pattern other than GND.

<Concerning Various Types of Protection Circuits>

Next, the abnormal protection circuit 50 housed in the present IC1 will be described in detail.

(Temperature Protection Circuit)

A temperature protection circuit (thermal shutdown circuit) 51 is housed as a countermeasure to overheating. When the chip temperature of the present IC1 is 175° C. (typ.) or higher, the present IC1 sets the FET drain output terminal (OUT) in an open state. When the chip temperature of the present IC1 is 150° C. (typ.) or lower, the present IC1 automatically returns to normal operation. However, care should be taken in that the present IC1 is liable to undergo thermal runaway or be destroyed when heat is continuously applied from the exterior, even when the temperature protection circuit 51 is in an operating state, i.e., in a state in which a temperature abnormality has been detected and the FET drain output terminal (OUT) is in an open state.

(Overcurrent Protection Circuit)

The present IC1 houses an overcurrent protection circuit 52 as a countermeasure to damage when the FET drain output terminal (OUT) is connected to power (short-circuited to the power source or to the high potential end of a component similar to a power source). When a specified current flows across 4 µs (typ.), the overcurrent protection circuit 52 latches the FET drain output terminal (OUT) in an open state. The present IC1 returns to normal operation when the power source is turned on again or reset by the ENABLE terminal. The overcurrent protection circuit 52 is a circuit used for preventing damage to the present IC1 due to overcurrent in an abnormal state, and is not meant for use as a protection or safeguard of the set. For this reason, the function of the overcurrent protection circuit 52 should not be used for designing protection of the set in which the overcurrent protection circuit is used. When restoration after overcurrent protection operation is carried out by switching the power source on again or by resetting while in an abnormal state, it is possible that the overcurrent protection operation will be repeated by the sequence of latching, restoration, and latching, and the present IC1 is liable to produce heat, or to undergo degradation or the like. Also, it is important that current does not flow at or above the output rating because the present IC1 will produce heat, Tjmax of 150° C. will be exceeded, and the present IC1 is liable to degrade when current flows at or below the overcurrent detection threshold and yet above the output current rating.

(Under-Voltage Lockout Circuit)

The under-voltage lockout circuit 53 is housed in the present IC1 in order to prevent malfunction of the IC output or the like when the power source is at low voltage. The under-voltage lockout circuit 53 sets the FET drain output terminal (OUT) in an open state when the voltage applied to the power source terminal (VCC) is 7 V (typ.) or less. A hysteresis of 1 V (typ.) is designed into the threshold voltage in order prevent noise or other malfunction.

(Ghost Supply Malfunction Prevention Circuit)

The present IC1 is provided with a function unit (see the internal circuit indicated by reference numeral A1 of FIG. 3A) for preventing a malfunction in which voltage ends up being supplied to the present IC1 or to the power source terminal of other ICs on the set, from a logic control input terminal (IN) to the power source terminal (VCC) via a diode for preventing electrostatic damage when a logic control signal has been inputted in a state in which power is not applied. Therefore, the circuit does not malfunction even when voltage is imparted to a logic control input terminal (IN) in a state in which the power supply is not switched on.

<Concerning the Load Connection Detection Function>

Next, the load connection detection function that can be used in the present IC1 will be described in detail.

Figure 5:
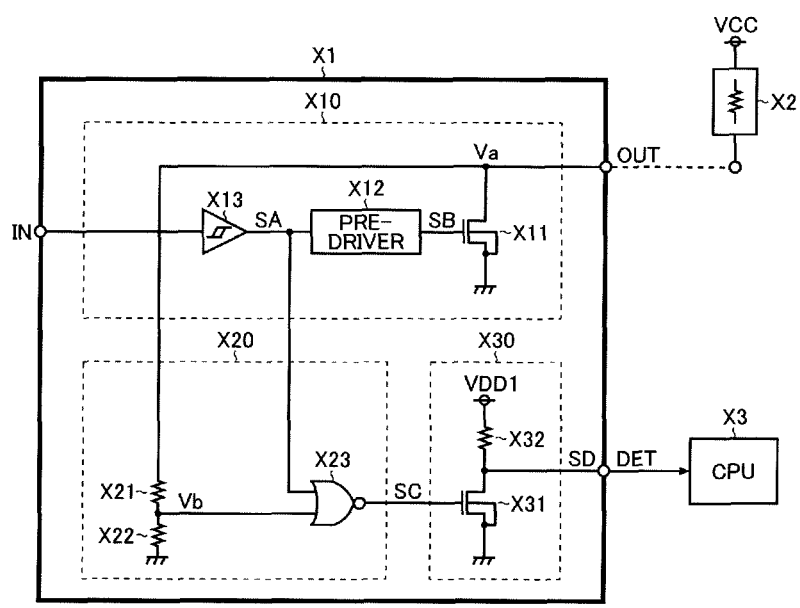
FIG. 5 is a view showing a first configuration example of the load drive device equipped with a load connection detection function.

FIG. 5 is a view showing a first configuration example of a load drive device equipped with a load connection detection function. A load drive device X1 shown in FIG. 5 has a load drive unit X10, a connection detection unit X20, and a signal output unit X30.

The load drive unit X10 constitutes means for switching on/off the output current IOUT that flows to a load X2, and has an n-channel DMOS field-effect transistor X11, a pre-driver X12, and a Schmitt buffer X13. The output transistor X11, the pre-driver X12, and the Schmitt buffer X13 that forms the load drive unit X10 correspond to the output transistors 11 to 14, the pre-drivers 21 to 24, and the Schmitt buffers 31 to 34, respectively, shown in FIG. 1 described above, and a duplicate description is omitted.

A connection detection unit X20 constitutes means for detecting whether the load X2 (resistance value: RZ) is correctly connected to the output terminal (OUT) of the load drive device X1, and has a resistor X21 (resistance value: R1), resistor X22 (resistance value: R2), and a NOR arithmetic unit X23.

The resistors X21 and X22 are connected in series between the output terminal OUT and the ground end of the load drive device X1, and the voltage Va that appears at the output terminal OUT is divided in a predetermined divided-voltage ratio (=R2/(R1+R2)), whereby these resistors function as a voltage-dividing circuit for outputting a divided voltage Vb from the connection nodes of the resistor X21 and the resistor X22. In the case that the load X2 is connected to the output terminal OUT, a current constantly flows to the resistor X21 and the resistor X22. For this reason, it is important to set the resistance values R1 and R2 high and to sufficiently reduce the current that flows to the resistor X21 and the resistor X22 in order to prevent unintended malfunction of the load X2 and to suppress wasteful current consumption.

The NOR arithmetic unit X23 generates a NOR signal SC between an input signal SA inputted from the input terminal IN via the Schmitt buffer X13 and the divided voltage Vb inputted from the connection node between the resistor X21 and the resistor X22, and then sends the result to the signal output unit X30. In the case that the input signal SA is a low level (output transistor X11: off), the logic level of the NOR signal SC is determined in accordance with the voltage value of the divided voltage Vb. More specifically, the logic level of the NOR signal SC will become a low level if the divided voltage Vb is greater than the logic threshold voltage Vth of the NOR arithmetic unit X23, and will become a high level if the divided voltage Vb is lower. In the converse case that the input signal SA is a high level (output transistor X11: on), the logic level of the NOR signal SC will constantly be a low level regardless of the voltage value of the divided voltage Vb.

The signal output unit X30 constitutes means for generating a connection detection signal SD on the basis of the NOR signal SC inputted from the connection detection unit X20 and sending the connection detection signal SD from the connection detection terminal DET to a central processing device X3, and has an n-channel MOS field-effect transistor X31 and a resistor X32. The drain of the transistor X31 is connected to the logic power source end (VDD1) via the resistor X32 and is also connected to the connection detection terminal DET. The source of the transistor X31 is connected to the ground end. The NOR signal SC is inputted to the gate of the transistor X31 and is used for switching the transistor X31 on and off. In other words, when the NOR signal SC is a high level, the transistor X31 is switched on and the connection detection signal SD is set to a low level. Conversely, when the NOR signal SC is a low level, the transistor X31 is switched off and the connection detection signal SD is set to a high level.

FIG. 5 provides an example of a configuration in which the resistor X32 is integrated inside a semiconductor device, but the configuration of the signal output unit X30 is not limited thereby; it being also possible to use a configuration in which a pull-up resistance is provided outside the connection detection terminal DET in an open drain format.

The operation of load connection detection function of the load drive device X1 having the above-described configuration will be described in greater detail.

In the load drive device X1 having the above-described configuration, the detection of the connection of the load X2 is carried out when the input signal SA is set at a low level and the output transistor X11 is set in an open state. At this point, the output terminal OUT is in a floating state when the load X2 is connected to the output terminal OUT, and the divided voltage Vb and the voltage Va that appears at the output terminal OUT are therefore set to 0 V (GND) via the resistor X21 or the resistor X22. Conversely, the output terminal OUT is connected to power source line (VCC) via the load X2 when load X2 is connected to the output terminal OUT, and the voltage Va that appears at the output terminal OUT therefore becomes VCC*{R2/(R1+R2+RZ)}.

For example, when the power source voltage VCC is 24 V, and the input voltage range of the NOR arithmetic unit X23 is 0 to 5 V, and the threshold voltage Vth is 2.5 V, the resistance values R1 and R2 can be set so that the divided voltage Vb (=VCC*{R2/(R1+R2+RZ)}) obtained during load connection is 5 V. The divided voltage Vb can be input without interference to the NOR arithmetic unit X23 by setting the resistance values in this manner.

In the case that the resistance values R1 and R2 are set as described above, the NOR signal SC becomes a low level, the transistor X31 is switched off, and the connection detection signal SD becomes a high level, because a voltage of 5 V is obtained as the divided voltage Vb if the load X2 is correctly connected to the output terminal OUT. On the other hand, if the load X2 is not correctly connected to the output terminal OUT, the NOR signal SC becomes a high level, the transistor X31 is switched on, and the connection detection signal SD becomes a low level, because the divided voltage Vb is 0 V. Therefore, in the central processing device X3, monitoring the logic level of the connection detection signal SD makes it possible to detect whether the load X2 is correctly connected to the output terminal OUT of the load drive device X1; therefore, system errors can be checked in advance at the time of product shipment and during system startup.

In a load drive device X1 having the configuration described above, the connection detection unit X20 is configured having the NOR arithmetic unit X23 as means for allowing the load connection detection operation described above only when the input signal SA is a low level (output transistor X11: off), and prohibiting the load connection detection operation when the input signal SA is a high level (output transistor X11: on). With such a configuration, the input signal SA is set to a high level during normal operation of the load drive device X1, and when the output transistor X11 is on, the logic level of the NOR signal SC is kept at a low level regardless of the voltage value of the divided voltage Vb, even when the divided voltage Vb and the voltage Va that appears at the output terminal OUT are 0 V, and the logic level of the connection detection signal SD is kept at a high level. Therefore, providing a NOR arithmetic unit X23 makes it possible to improve the reliability of the set because the load connection detection operation can be continuously carried out without erroneously detecting the connection state of the load X2, not only at the time of product shipment and system startup, but also during normal operation of the load drive device X1.

However, if the load connection detection operation is to be carried out only at the time the product is shipped and at system startup, an inverter, buffer, or other simpler logic gate can be used because it is sufficient to fix the input signal SA at a low level and to keep the output transistor X11 in an off state for only the interval of the load connection detection operation.

Figure 6:
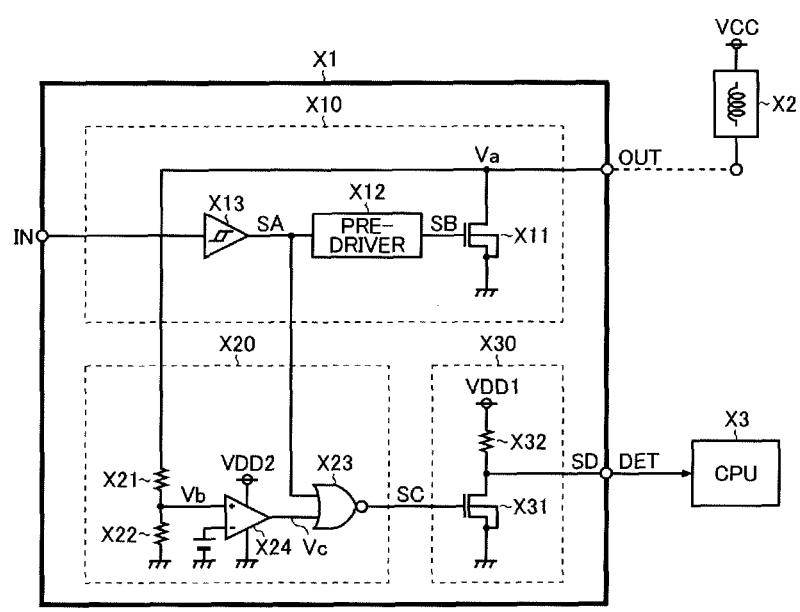
FIG. 6 is a view showing a second configuration example of the load drive device equipped with a load connection detection function.

FIG. 6 is a view showing a second configuration example of a load drive device equipped with a load connection detection function. The load drive device X1 shown in FIG. 6 has substantially the same configuration as the first configuration example described above, and features the addition of a comparator X24 as a constituent element of the connection detection unit X20. In view of the above, a duplicate description of the portions that are similar to the first configuration example will be omitted and the same reference numerals as those in FIG. 5 will be used; and the following description will be made with emphasis only on the characteristic portions of the second configuration example.

No special problems occur in the first configuration example described above when a resistor or other non-inductive load is connected as the load X2, but when a solenoid, motor coil, or other inductive load is connected, the voltage Va that appears at the output terminal OUT is rapidly increased by the counter voltage of the load X2 when the output transistor X11 is switched from on to off, and the NOR arithmetic unit X23 is therefore liable to be destroyed depending the divided voltage ratio (=R2/(R1+R2)) of the voltage-dividing circuit.

For example, as described above, in the case that the divided voltage ratio of the voltage-dividing circuit has been set so that the divided voltage Vb is 5 V when the power source voltage VCC is 24 V, the voltage Va that appears at the output terminal OUT rapidly increases to 100 V due to the counter voltage of the load X2 when the output transistor X11 is switched from on to off, whereupon the divided voltage Vb becomes about 20 V, which exceeds the input withstand voltage of the NOR arithmetic unit X23 and may lead to damage.

Presuming that the voltage Va that appears at the output terminal OUT rapidly increases to 100 V due to the counter voltage of the load X2, the divided-voltage ratio of the voltage-dividing circuit can be set in advance to a low ratio in order to prevent withstand-voltage damage. Since the divided voltage Vb does not become excessively large when the divided-voltage ratio is set as described above, the latter-stage circuitry can be protected from damage even if the withstand voltage of latter-stage circuitry to which the divided voltage Vb is inputted is not made unnecessarily high.

However, when the transient phenomenon described above (rapid increase in voltage Va) has passed, the divided voltage Vb falls to about 1.2 V when the divided-voltage ratio is set in the manner described above, because the voltage Va falls to about the power source voltage VCC (e.g., 24 V). Thus, after this transient phenomenon has passed, the divided voltage Vb increases to only 1.2 V even when the load X2 is correctly connected to the output terminal OUT, and the logic threshold voltage Vth (e.g., 2.5 V) of the NOR arithmetic unit X23 therefore cannot be surpassed and the logic level of the NOR signal SC cannot be inverted even if the divided voltage Vb is directly inputted to the NOR arithmetic unit X23.

In view of the above, in the load drive device X1 of the second configuration example, the comparator X24 is added as a constituent element of the connection detection unit X20. The comparator X24 compares the divided voltage Vb and a predetermined threshold voltage (e.g., 0.6V) and sends to the NOR arithmetic unit X23 a comparison result signal Vc having a logic level that corresponds to the comparison result. More specifically, the logic level of the comparison result signal Vc is a high level if the divided voltage Vb is greater than a predetermined threshold value, and is a low level if the divided voltage Vb is lower. The comparator X24 is driven between the power source voltage VDD2 (e.g., 5 V) and the ground voltage GND (0 V). In other words, the high level of the comparison result signal Vc is 5 V and the low level is 0 V. The addition of such a comparator X24 makes it possible to surpass the logic threshold voltage Vth of the NOR arithmetic unit X23 and invert the logic level of the NOR signal SC because a comparison result signal Vc having a high level (5 V) can be outputted to the NOR arithmetic unit X23 from the comparator X24 even if the divided voltage Vb increases to only 1.2 V.

Figure 7A:
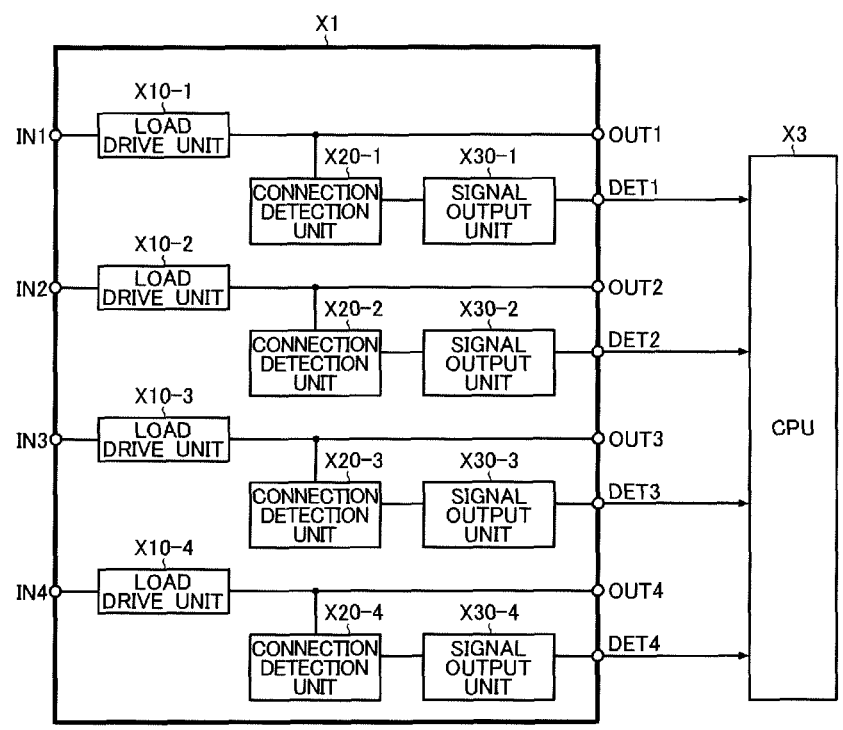
FIG. 7A is a view showing a first output mode of the connection detection signal detected by each of a plurality of load drive lines.
Figure 7B:
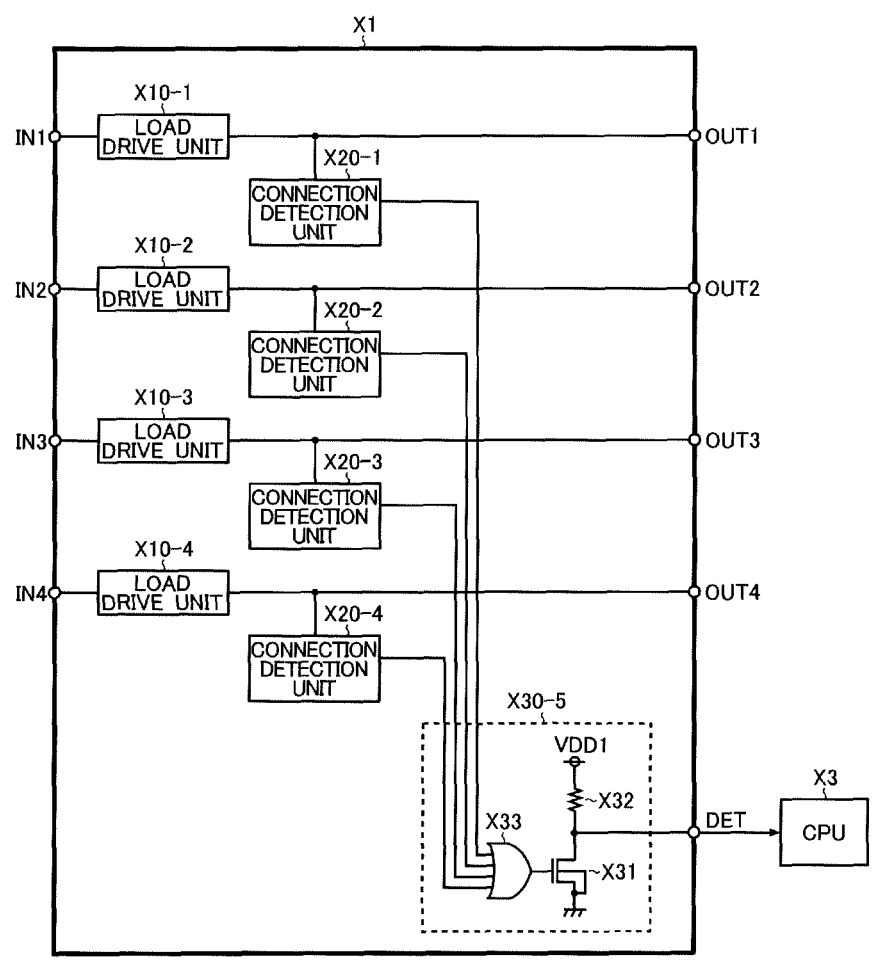
FIG. 7B is a view showing a second output mode of the connection detection signal detected by each of a plurality of load drive lines.

FIGS. 7A and 7B are block diagrams showing first and second output modes of a connection detection signal detected by each of a plurality of load drive lines.

For each of the four load drive units X10-1 to X10-4, the load drive device X1 shown in FIG. 7A has connection detection units X20-1 to X20-4 and signal output units X30-1 to X30-4, respectively, and each independent connection detection signal for each of the load drive lines is configured for output to the central processing unit X3. The load drive units X10-1 to X10-4, the connection detection units X20-1 to X20-4, and the signal output units X30-1 to X30-4 are the same as the load drive unit X10, the connection detection unit X20, and the signal output unit X30, respectively, shown in FIGS. 5 and 6, and a duplicate description of the circuit configurations and operations is therefore omitted.

With the central arithmetic device X3, the load drive lines in which a problem has occurred (load displacement) can be rapidly identified by using the configuration shown in FIG. 7A.

For each of the four load drive units X10-1 to X10-4, the load drive device X1 shown in FIG. 7B has connection detection units X20-1 to X20-4, has a single signal output unit X30-5, that is shared by each load drive line, and is configured to output a single connection detection signal to the central processing unit X3. The load drive units X10-1 to X10-4 and the connection detection units X20-1 to X20-4 are the same as the load drive unit X10 and the connection detection unit X20, respectively, shown in FIGS. 5 and 6, and a duplicate description of the circuit configurations and operations is therefore omitted. On the other hand, the signal output unit X30-5 has essentially the same circuit configuration as the signal output unit X30 shown in FIGS. 5 and 6, but also features the addition of a logic OR arithmetic unit X33 in addition to the transistor X31 and the resistance X32.

The logic OR arithmetic unit X33 performs a logic OR operation on the signals (see the NOR signal SC of FIGS. 5 and 6) inputted from the four connection detection units X20-1 to X20-4, and the result of the operation is fed to the gate of the transistor X31.

Since the number of connection detection signals DET can be reduced by using the configuration shown in FIG. 7B, the load drive device X1 can be made smaller.

In a configuration that uses the logic OR unit X33 as a logic gate for consolidating the signals inputted from the four connection detection units X20-1 to X20-4 into a single line, as shown in FIG. 7B, the reliability of the system is not compromised because the central processing unit X3 can be notified when a problem (load displacement) occurs in any of the load drive lines.

<Concerning the Output Transistor Protection Function>

Next, the output transistor protection function that can be used in the present IC1 will be described in detail.

Figure 8:
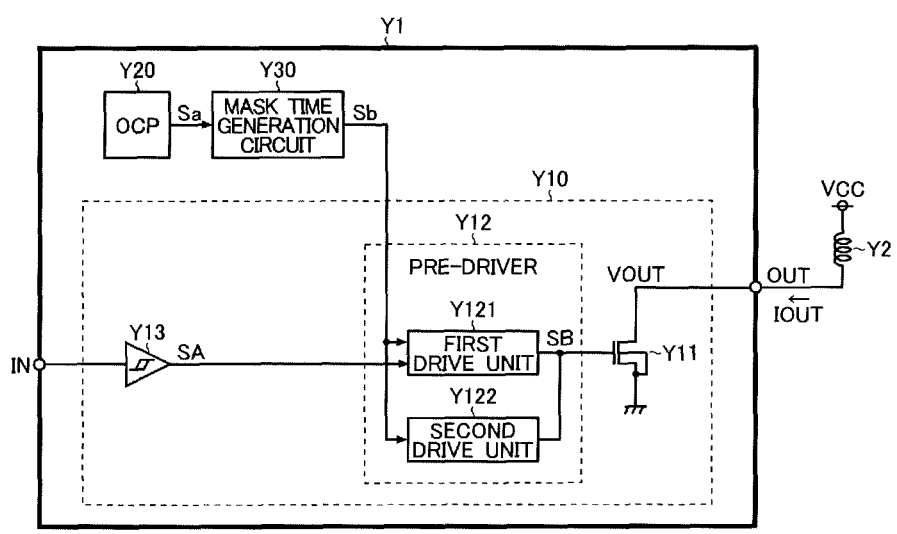
FIG. 8 is a view showing a first configuration example of the load drive device equipped with an output transistor protection function.

FIG. 8 is a view showing a first configuration example of the load drive device equipped with an output transistor protection function. The load drive device Y1 has a load drive unit Y10, an overcurrent protection circuit Y20, and a mask time generation circuit Y30.

The load drive unit Y10 constitutes means for switching on/off the output current IOUT that flows to a load Y2 (solenoid, motor coil, or another inductive load), and has an n-channel DMOS field-effect transistor Y11, a pre-driver Y12, and a Schmitt buffer Y13. The output transistor Y11, the pre-driver Y12, and the Schmitt buffer Y13 that forms the load drive unit Y10 correspond to the output transistors 11 to 14, the pre-drivers 21 to 24, and the Schmitt buffers 31 to 34, respectively, shown in FIG. 1 described above, and a duplicate description is omitted. However, the internal configuration of the pre-driver Y12 includes details (an internal configuration for implementing an output transistor protection function during overcurrent protection operation) that have not yet been described, and a detailed description is provided below.

The pre-driver Y12 constitutes means for generating a control signal SB (gate signal) of the output transistor Y11 in accordance with the input signal SA inputted via the Schmitt buffer Y13, and has a first drive unit Y121 for switching the output transistor Y11 on/off during normal operation, and a second drive unit Y122 for switching off the output transistor Y11 more slowly than the first drive unit Y121 during overcurrent protection operation.

The overcurrent protection circuit Y20 detects whether the output current IOUT is in an overcurrent state, and generates an overcurrent detection signal Sa. More specifically, the logic level of the overcurrent detection signal Sa is a high level if the output current IOUT is greater than a predetermined threshold value (OCP threshold), and is a low level if the output current IOUT is lower. The overcurrent protection circuit Y20 corresponds to the overcurrent protection circuit 52 shown in FIG. 1 described above.

The mask time generation circuit Y30 raises the overcurrent protection signal Sb sent to the load drive unit Y10 from a low level to a high level to instruct the load drive unit Y10 to carry out overcurrent protection operation (forcible halt operation of the output transistor Y11) when the overcurrent state of the output current IOUT has continued over a predetermined mask time Tm, i.e., when the overcurrent detection signal Sa has been kept at a high level over a predetermined mask time Tm. Malfunction of overcurrent protection can be avoided even when, e.g., noise is superimposed on the overcurrent detection signal Sa, by providing such a mask time generation circuit Y30.

The output transistor protection function of the load drive device Y1 having the configuration described above will be described in greater detail with reference to FIG. 9.

Figure 9:
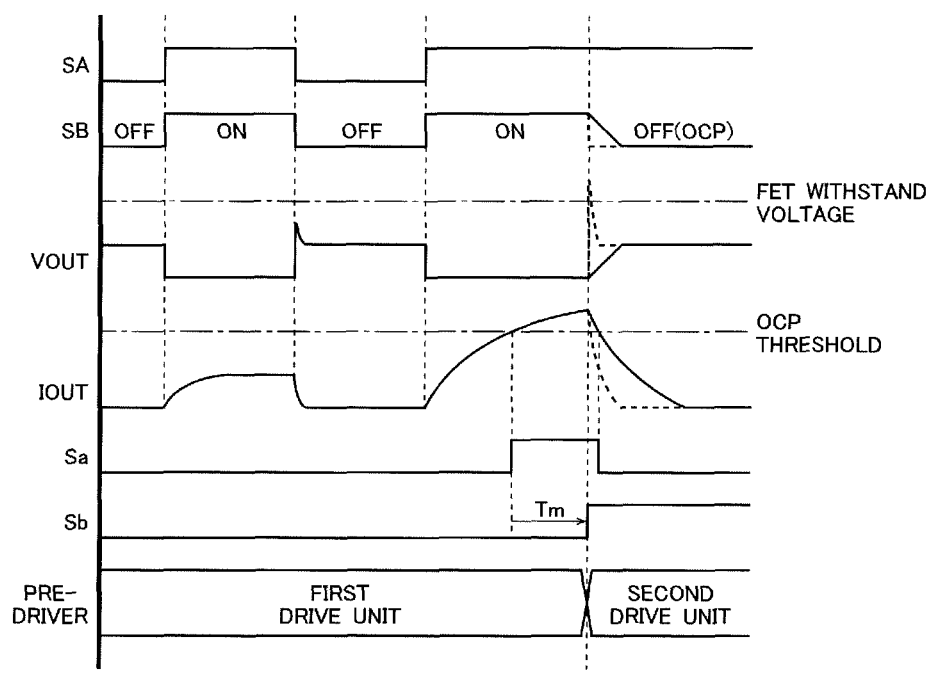
FIG. 9 is a flowchart for describing the output transistor protection function.

FIG. 9 is a flowchart for describing the output transistor protection function during overcurrent protection operation, and drawn in sequence are the operation states (selected states of the first drive unit Y121 and the second drive unit Y122) of the input signal SA, the control signal SB of the output transistor Y11, the output voltage VOUT, the overcurrent IOUT, the overcurrent detection signal Sa, the overcurrent protection signal Sb, and the pre-driver Y12. In the description below, the mask time generation circuit Y30 is configured so that after the overcurrent protection signal Sb has been raised from a low level to a high level, the logic level of the overcurrent protection signal Sb is latched at a high level in order to maintain the forcibly stopped state of the output transistor Y11, but the use of such a latch function is optional.

When the input signal SA inputted to the input terminal IN is a high level during normal operation of the load drive device Y1, as shown in FIG. 9, a gate signal SB of the output transistor Y11 is set at a high level, the output transistor Y11 is switched on, and the output voltage VOUT that appears at the output terminal OUT is pulled down to a low level (near ground potential (GND)). Conversely, when the input signal SA inputted to the input terminal IN is a low level, the gate signal SB of the output transistor Y11 is set at a low level, the output transistor Y11 is switched off, and the output voltage VOUT that appears at the output terminal OUT is pulled up to a high level (near power source potential (VCC)).

The output transistor Y11 is rapidly switched on and off using the first drive unit Y121 of the pre-driver Y12 in order to keep switching loss of the output transistor Y11 to a minimum during normal operation of the load drive device Y1. In other words, the overcurrent protection signal Sb fed to the output transistor Y11 is rapidly switched between a high level and a low level.

Thus, when the output transistor Y11 is rapidly switched on and off, a counter voltage is generated by the inductive load Y2 or the inductance component of the IC interior and the substrate wiring, and the output voltage VOUT that appears at the output terminal OUT rapidly increases. However, the output transistor Y11 is designed so that the output voltage VOUT applied to itself does not exceed the withstand voltage when the counter voltage described above is generated, with consideration given to the counter voltage that may be generated during normal operation of the load drive device Y1.

On the other hand, when the output current IOUT that flows to the load Y2 reaches a predetermined threshold, the overcurrent protection circuit Y20 detects that the output current IOUT is in an overcurrent state and sets the overcurrent detection signal SA from a low level to a high level. A mask time generation circuit Y30 sets the overcurrent protection signal Sb from a low level to a high level when the overcurrent detection signal Sa has been kept at a high level over a predetermined mask time Tm.

The overcurrent protection signal Sb is inputted to the first drive unit Y121 and the second drive unit Y122 that form the pre-driver Y12. The first drive unit Y121 sets the output level to high impedance regardless of the input signal SA when the overcurrent protection signal Sb has been raised to a high level. The second drive unit Y122 slowly pulls the gate signal down to a low level in order to switch the output transistor Y11 off more slowly than does the first drive unit Y121 when the overcurrent protection signal Sb has been raised to a high level. The output transistor Y11 is forcibly switched off by such an overcurrent protection operation and the overcurrent state of the output current IOUT is resolved.

The overcurrent state of the output current IOUT can be quickly resolved when the output transistor Y11 is rapidly shut off using the first drive unit Y121 during the overcurrent protection operation described above, but in relation to the output current IOUT, the output voltage VOUT applied to the output transistor 101 is liable to exceed the withstand voltage and destroy the output transistor Y11 because a counter voltage that is far greater than the counter voltage generated during normal operation is generated, and the output transistor Y11 is liable to be damaged (see the gate signal SB, the output current IOUT, and the output voltage VOUT indicated by broken lines).

On the other hand, when the output transistor Y11 is slowly shut off using the second drive unit Y122, the time required for resolving an overcurrent state of the output current IOUT is slightly increased, but in relation to the rapid increase in the output voltage VOUT, withstand voltage damage to the output transistor Y11 can be prevented in advance because it is possible to reduce the counter voltage produced when the output transistor Y11 is shut off (see the gate signal SB, the output current IOUT, and the output voltage VOUT shown as solid lines).

Therefore, with the load drive device Y1 shown in FIG. 8, it is possible to contribute to reducing the size and cost of the load drive device Y1 because switching loss during normal operation can be reduced and the output transistor Y11 can be protected without unnecessarily increasing the withstand voltage of the Y11.

Figure 10:
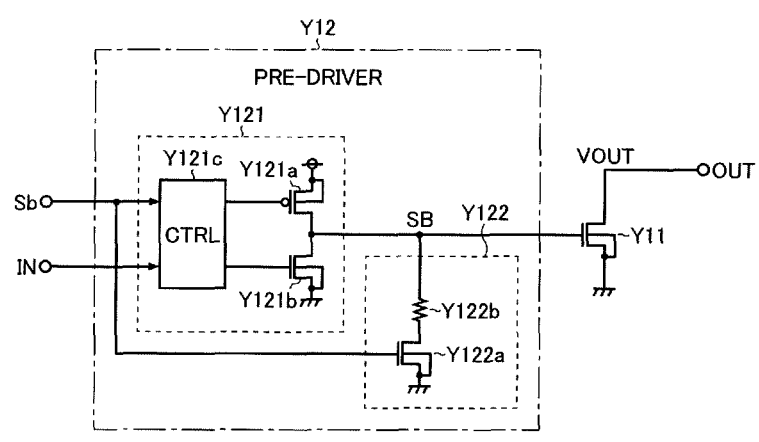
FIG. 10 is a circuit diagram showing a configuration example of the pre-driver Y12.

FIG. 10 is a circuit diagram showing a configuration example of the pre-driver Y12, As shown in FIG. 10, the first drive unit Y121 has a p-channel MOS field-effect transistor Y121a connected between the power source end and the gate of the output transistor Y11, an n-channel MOS field-effect transistor Y121b connected between the ground end and the gate of the output transistor Y12, and a control unit Y121 for switching the transistor Y121a and the transistor 121b on and off. The input signal SA and the overcurrent protection signal Sb are inputted to the control unit Y121c.

The second drive unit Y122 has a n-channel MOS field-effect transistor Y122a connected between the ground end and the gate of the output transistor Y11, and a current-limiting resistor Y122b connected in series with the transistor 122a. The overcurrent protection signal Sb is inputted to the gate of the transistor Y122a.

Next, the operation of the pre-driver Y12 having the configuration described above will be described in detail.

When the overcurrent protection signal Sb is a low level, the control unit Y121 included in the first drive unit Y121 switches the transistor Y121a and the transistor Y121b of and off so as to generate a gate signal SB of the output transistor Y11 in accordance with the input signal SA. More specifically, when the input signal SA is at a high level, the transistor Y121a is switched on and the transistor Y121b is switched off in order to set the gate signal SB of the output transistor Y11 to a high level. Conversely, when the input signal SA is at a low level, the transistor Y121a is switched off and the transistor Y121b is switched on in order to set the gate signal SB of the output transistor Y11 to a low level. On the other hand, the transistor Y122a included in the second drive unit Y122 is switched off when the overcurrent protection signal Sb is at a low level. Thus, the output transistor Y11 is rapidly switched on and off using the first drive unit Y121 and the second drive unit Y122 is not driven during normal operation of the load drive device Y1.

In contrast, when the overcurrent protection signal Sb is at a high level, the control unit Y121c included in the first drive unit Y121 switches off the transistor Y121a and the transistor Y121b in order to set the output level of the first drive unit Y121 at high impedance regardless of the input signal SA. On the other hand, when the overcurrent protection signal Sb is at a high level, the transistor Y122a included in the second drive unit Y122 is switched on, and the gate signal SB of the output transistor Y11 is slowly pulled down to a low level via the current-limiting resistance 122b. Thus, the output transistor Y11 is slowly switched off using the second drive unit Y122 and the first drive unit Y121 is not driven during overcurrent protection operation of the load drive device Y1.

Next, the output transistor protection operation described above will be described in detail with reference to FIG. 11 in relation to problems that occur when the input signal SA been lowered to a low level between the time that the overcurrent detection signal Sa has been raised to a high level and the time when a predetermined mask-time Tm has elapsed, i.e., the case in which an instruction to switch the output transistor Y11 off before the mask-time Tm has elapsed.

Figure 11:
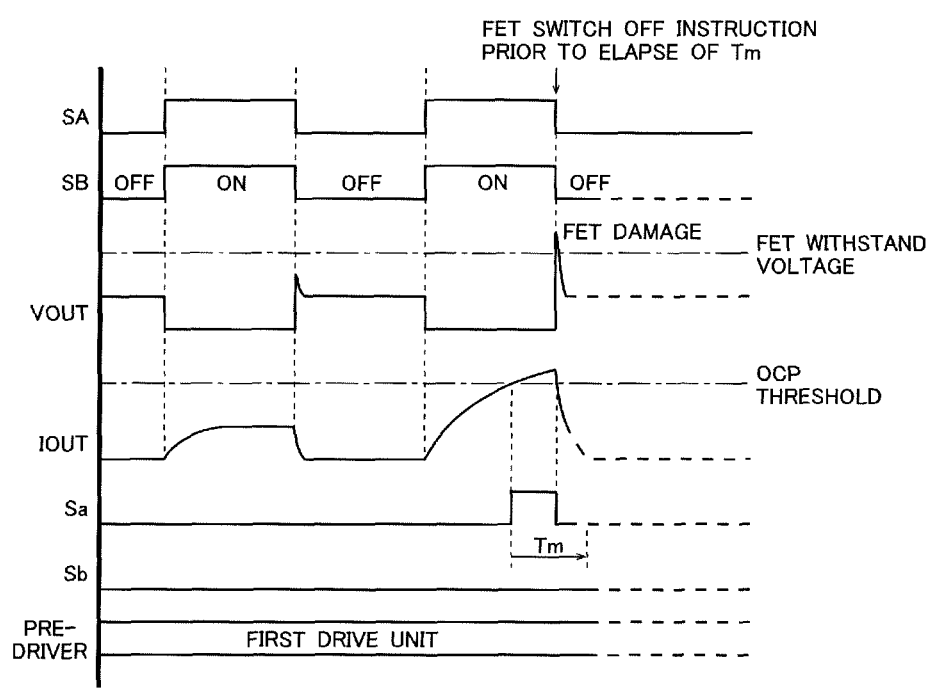
FIG. 11 is a flowchart for describing the problems of the output transistor protection operation.

FIG. 11 is a flowchart for describing the problems that can occur in the output transistor protection operation, and the items and ordering in the diagram are the same as those of FIG. 9 described above. As shown in FIG. 11, the pre-driver Y12 rapidly switches off the output transistor Y11 using the first drive unit Y121 because the overcurrent protection signal Sb has not yet been raised to a high level when the input signal SA been lowered to a low level between the time that the overcurrent detection signal Sa has been raised to a high level and the time when a predetermined mask-time Tm has elapsed. At this time, since an excessive output current IOUT is flowing to a load 200, a counter voltage that is far greater than the counter voltage generated during normal operation is generated when the output transistor Y11 is rapidly shut off using the first drive unit Y121, the output voltage VOUT applied to the output transistor Y11 is liable to exceed the withstand voltage, and the output transistor Y11 is liable to be destroyed.

Figure 12:
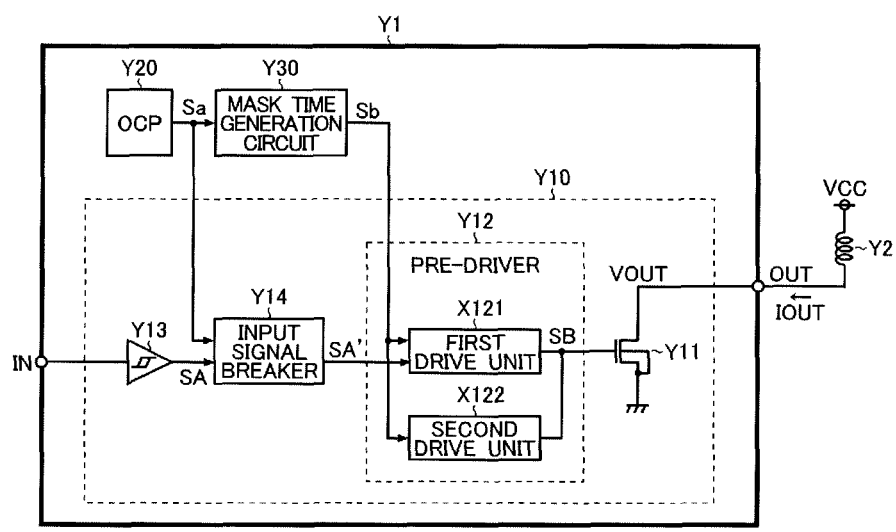
FIG. 12 is a view showing a second configuration example of the load drive device equipped with an output transistor protection function.

FIG. 12 is a view showing a second configuration example of the load drive device equipped with an output transistor protection function. The load drive device Y1 shown in FIG. 12 has substantially the same configuration as the first configuration example described above, and features the addition of an input signal breaker Y14 as a constituent element of the load drive unit Y10 for resolving the problems pointed out in FIG. 11. In view of the above, a duplicate description of the portions that are similar to the first configuration example will be omitted and the same reference numerals as those in FIG. 8 will be used; and the following description will be made with emphasis only on the characteristic portions of the second configuration example.

The input signal breaker Y14 constitutes means for cutting off the input signal SA without waiting for the mask-time Tm to elapse at the point that an overcurrent state of the output current IOUT has been detected, i.e., at the time that the overcurrent detection signal Sa has been raised to a high level. More specifically, the input signal breaker Y14 throughputs the input signal SA directly as the input signal SA' to the pre-driver Y12 when the overcurrent detection signal Sa is a low level, and conversely, when the overcurrent detection signal Sa is at a high level, the input signal breaker Y14 holds the logic level of the input signal SA inputted just prior thereto and outputs the latch signal as the input signal SA' to the pre-driver Y12.

Figure 13:
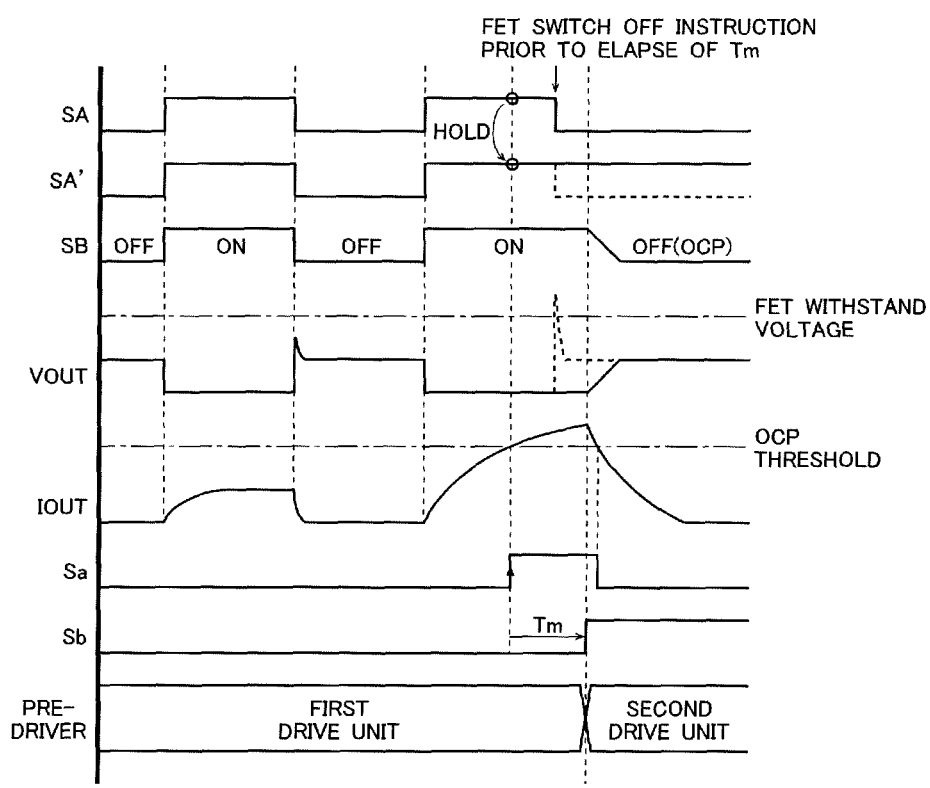
FIG. 13 is a flowchart for describing the shutoff effect of the input signal SA.

FIG. 13 is a flowchart for describing the breaker effect of the input signal SA, and the items and ordering in the diagram are essentially the same as those of FIGS. 9 and 11 described above. However, in FIG. 13, the input signal SA' generated by the input signal breaker Y14 is added between the input signal SA and the control signal SB of the output transistor Y11.

As shown in FIG. 13, the pre-driver Y12 rapidly switches the output transistor Y11 on and off using the first drive unit Y121 because the overcurrent protection signal Sb has not yet been raised to a high level when the input signal SA been lowered to a low level between the time that the overcurrent detection signal Sa has been raised to a high level and the time when a predetermined mask-time Tm has elapsed. Nevertheless, the input signal SA is cut off by the input signal breaker Y14 at the point at which the overcurrent detection signal Sa is raised to a high level, and the input signal SA inputted to the pre-driver Y12 (more specifically, the first drive unit Y121) is kept at a high level prior thereto even when the input signal SA is lowered to a low level before the mask-time Tm has elapsed. Therefore, withstand voltage damage to the output transistor Y11 can be prevented in advance because the output transistor Y11 is rapidly switched off in a state in which excessive output current IOUT is flowing to the load 200. Since the output transistor Y11 is slowly switched off using the second drive unit Y122 as described above after the mask-time Tm has elapsed, withstand voltage damage to the output transistor Y11 can be prevented in advance in this case as well.

Figure 14A:
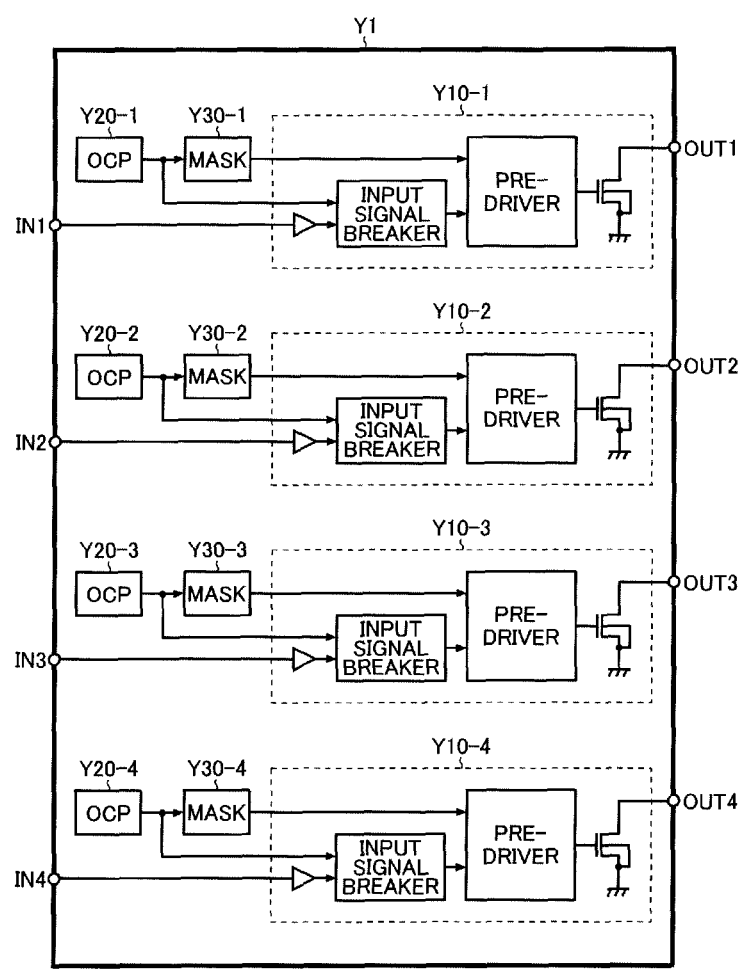
FIG. 14A is a block diagram showing a first application example in which an output transistor protection function has been provided to each of a plurality of load drive lines.
Figure 14B:
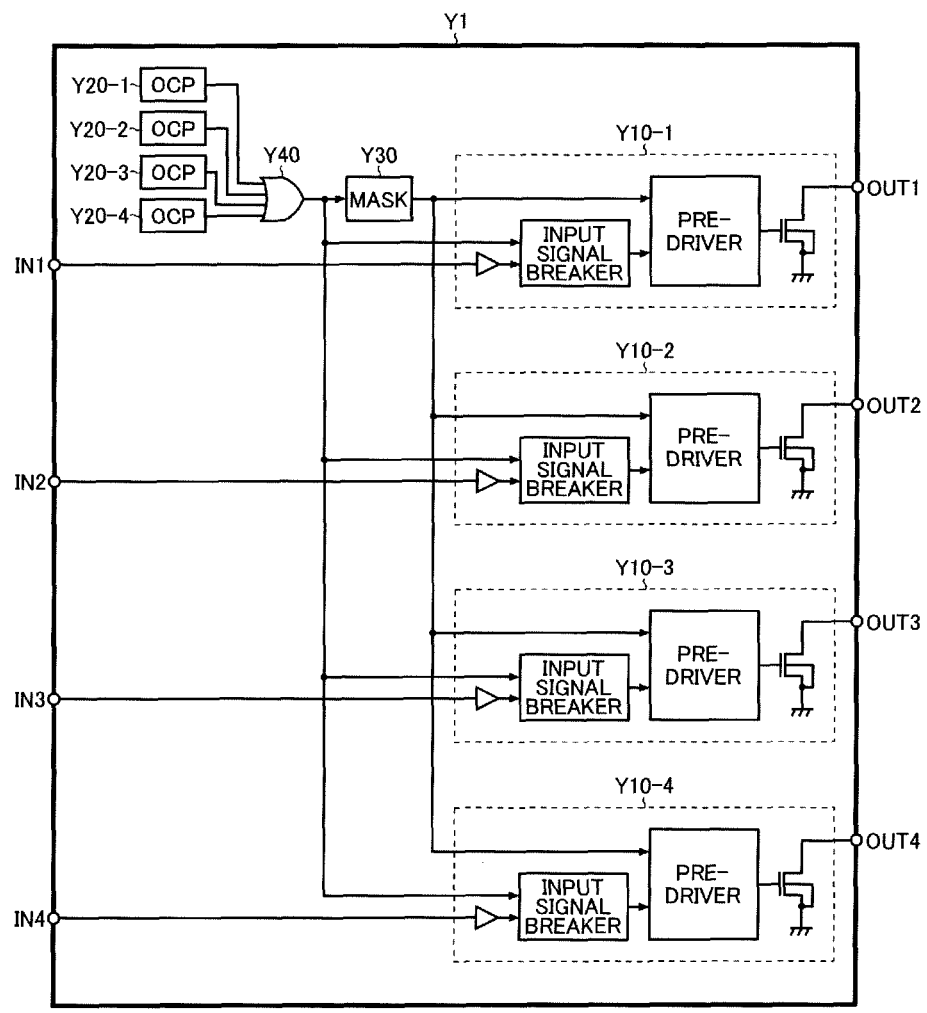
FIG. 14B is a block diagram showing a second application example in which an output transistor protection function has been provided to each of a plurality of load drive lines.

FIGS. 14A and 14B are block diagrams showing an application example in which an output transistor protection function has been provided to each of a plurality of load drive lines.

The load drive device Y1 shown in FIG. 14A has an inductive load connected to the four output terminals OUT1 to OUT 4, and has a configuration in which each of the load drive lines has one each of load drive units Y10-1 to Y10-4, overcurrent protection circuits Y20-1 to Y20-4, and mask time generation circuits Y30-1 to Y30-4. The load drive units Y10-1 to Y10-4, the overcurrent protection circuits Y20-1 to Y20-4, and the mask time generation circuits Y30-1 to Y30-4 are the same as the load drive unit Y10, the overcurrent protection circuit Y20, and the mask time generation circuit Y30, respectively, and a duplicate description of the circuit configurations and operations is therefore omitted.

It is therefore possible to increase the safety of the system using the configuration shown in FIG. 14A to suitably shut down only the load drive lines in which a problem (overcurrent) has occurred, and system safety is not unnecessarily reduced.

The load drive device Y1 shown in FIG. 14B has an inductive load connected to each of the four output terminals OUT1 to OUT 4; has one each of the load drive units Y10-1 to Y10-4 and the overcurrent protection circuits Y20-1 to 20-4 for each of the load drive lines; and has a single mask time generation circuit Y30 provided in common to the load drive lines, and a logic OR arithmetic unit Y40 for generating a logic OR signal of the overcurrent detection signals outputted from the overcurrent protection circuits Y20-1 to Y20-4 and supplying the logic OR signal to the mask time generation circuit Y30 and the input signal breakers included in the load drive units Y10-1 to Y10-4.

Using the configuration shown in FIG. 14B, it is possible to suitably shut down all of the load drive lines when a problem (overcurrent) has occurred in any of the load drive lines, and system safety can be maximized.

Figure 15:
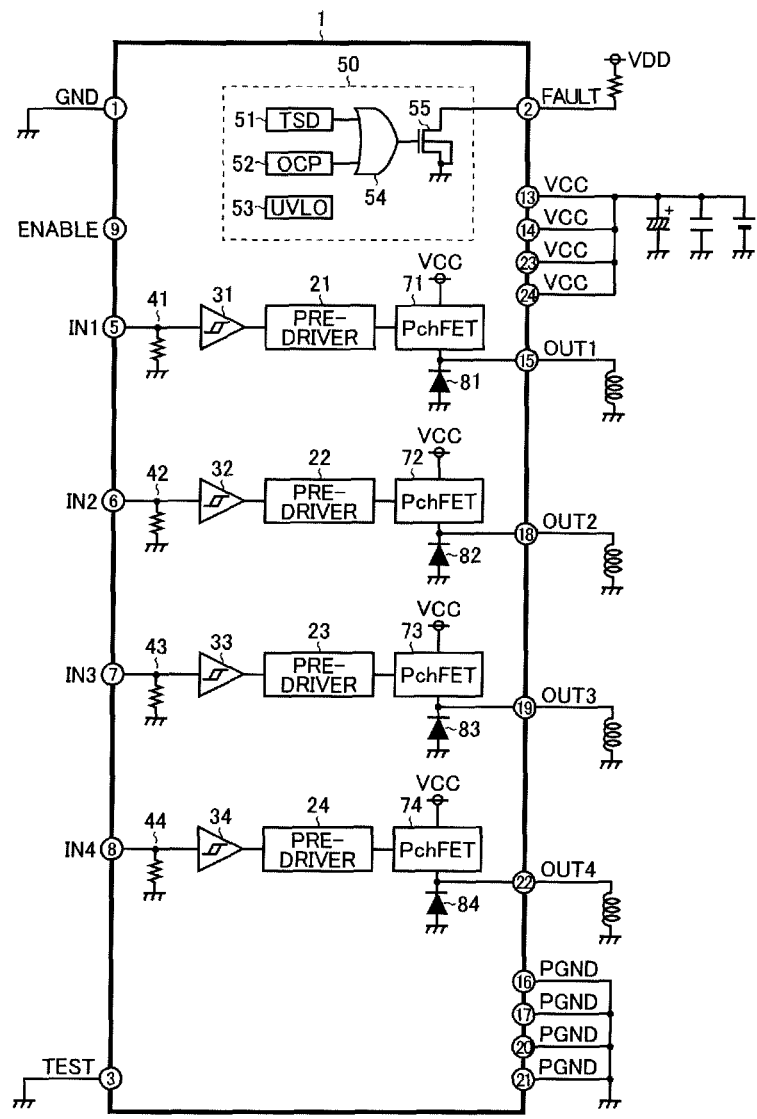
FIG. 15 is a block diagram schematically showing a first modified example of the semiconductor integrated circuit device of the present invention.
Figure 16:
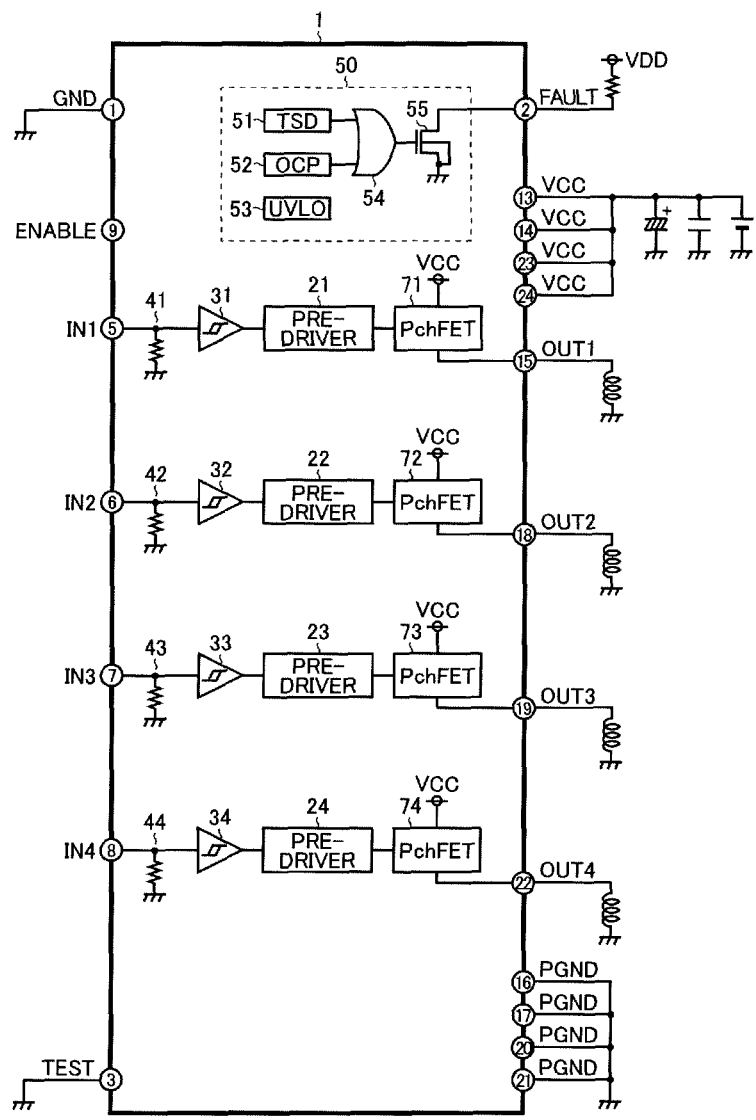
FIG. 16 is a block diagram schematically showing a second modified example of the semiconductor integrated circuit device of the present invention.
Figure 17:
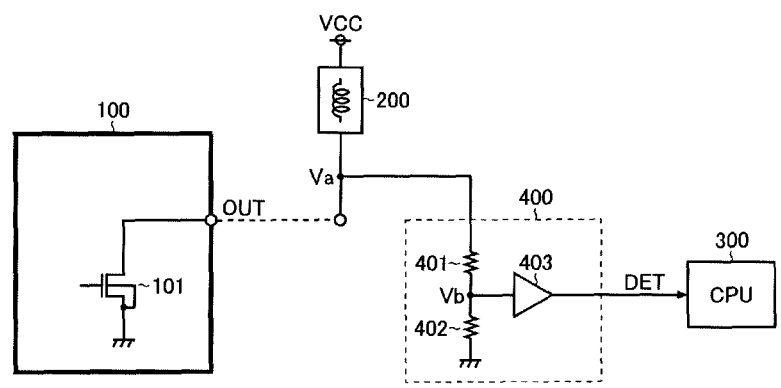
FIG. 17 is a view showing a first conventional example of a load drive device.
Figure 18:
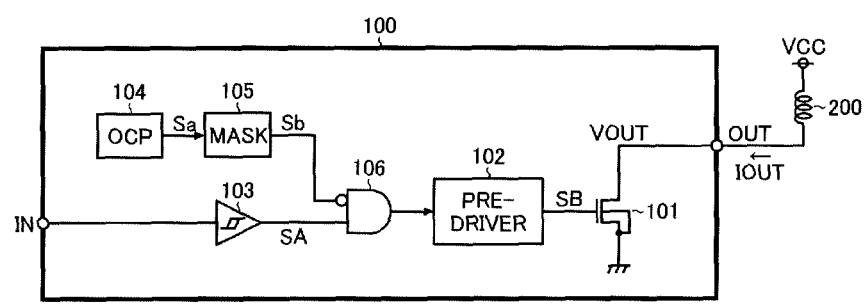
FIG. 18 is a view showing a second conventional example of a load drive device.
Figure 19:
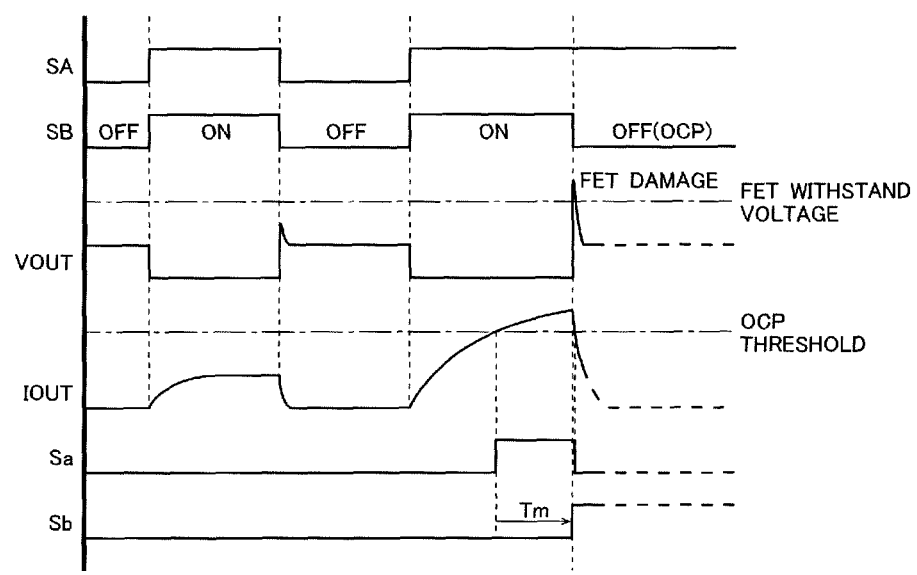
FIG. 19 is a timing chart showing an operation example of the load drive device shown in FIG. 18.

In the embodiments described above, configurations in which the present invention was applied to a low-side switch drive circuit were described, but the application target of the present invention is not limited thereby; application can also be widely made, e.g., to high-side switch drive circuits, as shown in FIG. 15. P-channel DMOS field-effect transistors 71 to 74 can be used as the high-side switch, as shown in FIG. 15. In this case, clamp diodes 81 to 84 can be connected between the ground end and the output terminals OUT1 to OUT4. The clamp diodes 81 to 84 may be omitted from the configuration in FIG. 15, as shown in FIG. 16.

In addition to the embodiments, the configuration of the present invention can be modified in various ways that do not depart for the spirit of the invention. In other words, the embodiments described above are exemplifications on all points and are not meant to be provided by way of limitation. The technical range of the present invention is indicated in the claims rather than in the description of the embodiments, and should be construed to include all meanings equivalent to the claims as well as modifications within the scope of the claims.

In terms of its industrial applicability, the present invention is a technique that can be used in load drive devices for controlling solenoid drives, DC brush motor drives, unipolar stepping motor drives, and the like in, e.g., PPC, MFP, and other OA equipment.

The best mode of the present invention is described above, but the disclosed invention can be modified in various ways, it being apparent to a person skilled in the art that various embodiments that differ from the specific configurations described above can be adopted. Therefore, the following claims are intended to include all modifications of the present invention in a technical range that does not depart from the spirit and technical scope of the present invention.

LIST OF REFERENCE NUMERALS 1 semiconductor integrated circuit device
11 to 14 n-channel DMOS field-effect transistors
21 to 24 pre-drivers
31 to 34 Schmitt buffers
41 to 44 pulldown resistors
50 abnormal protection circuit
51 temperature protection circuit
52 overcurrent protection circuit
53 under-voltage lockout circuit
54 logic OR arithmetic unit
55 n-channel MOS field-effect transistor
61 to 64 clamp diodes 71 to 74 p-channel DMOS field-effect transistors (output transistors)
81 to 84 clamp diodes
A1 internal circuit
A2 electrostatic protection diode
A3 pulldown resistor
A4 current-limiting resistor
A5 Schmitt buffer
B1 n-channel MOS field-effect transistor
B2 parasitic diode
B3 electrostatic protection diode
C1 n-channel DMOS field-effect transistor (output transistor)
C2 parasitic diode
C3 to C6 electrostatic protection diodes
C7 clamp diode
X1 load drive device
X2 load
X3 central processing unit (CPU)
X10, X10-1 to X10-4 load drive units
X11 n-channel DMOS field-effect transistor (output transistor)
X12 pre-driver
X13 Schmitt buffer
X20, X20-1 to X20-4 connection detectors
X21, X22 resistors
X23 NOR arithmetic unit (NOR)
X24 comparator
X30, X30-1 to X30-4, X30-5 signal output units
X31 n-channel MOS field-effect transistor
X32 resistor
X33 logic OR arithmetic unit (OR)
Y1 load drive device
Y2 load (inductive load)
Y10, Y10-1 to Y10-4 load drive units
Y11 n-channel DMOS field-effect transistor (output transistor)
Y12 pre-driver
Y121 first driver
Y121*a* p-channel MOS field-effect transistor
Y121*b* n-channel MOS field-effect transistor
Y121*c* controller
Y122 second driver
Y122*a* n-channel MOS field-effect transistor
Y122*b* current-limiting resistor
Y13 Schmitt buffer
Y14 input signal breaker
Y20, Y20-1 to Y20-4 overcurrent protection circuits
Y30, Y30-1 to Y30-4 mask time generation circuits
Y40 logic OR arithmetic unit

What is claimed is:

1. A load drive device comprising:
a load drive unit for switching on/off an output current that flows to an inductive load; and
an overcurrent protection circuit for detecting whether the output current is in an overcurrent state,
wherein the load drive unit comprises:
an output transistor connected to one end of the inductive load; and
a pre-driver for generating a control signal of the output transistor in accordance with an input signal,
wherein the pre-driver comprises:
a first drive unit for switching on/off the output transistor during normal operation; and
a second drive unit for switching off the output transistor more slowly than the first drive unit during overcurrent protection operation.

2. The load drive device of claim 1, further comprising:
a mask time generation circuit for instructing the load drive unit to carry out overcurrent protection operation when an overcurrent state of the output current has continued for a predetermined mask time.

3. The load drive device of claim 2, wherein the load drive unit has an input signal breaker for cutting off the input signal without waiting for the mask time to elapse when an overcurrent state of the output current has been detected.

4. The load drive device of claim 3, wherein the load drive device has a plurality of the inductive loads connected thereto, and has one each of the load drive unit, the overcurrent protection circuit, and the mask time generation circuit for each of a plurality of load drive lines.

5. The load drive device of claim 3, wherein the load drive device has a plurality of the inductive loads connected thereto; has one each of the load drive unit and the overcurrent protection circuit for each of a plurality of load drive lines; and has a single mask time generation circuit provided in common to the plurality of load drive lines, and a logic OR arithmetic unit for generating a logic OR signal of the overcurrent detection signals outputted from the plurality of overcurrent protection circuits and supplying the logic OR signal to the mask time generation circuit and the plurality of input signal breakers.

6. The load drive device of claim 1, wherein the load drive unit has a Schmitt buffer for transmitting the input signal to the pre-driver.

7. The load drive device of claim 1, wherein
the first drive unit comprises:
a first transistor connected between a power source end and a control end of the output transistor;
a second transistor connected between a ground end and the control end of the output transistor; and
a control unit for switching on/off the first and second transistors, and
wherein the second drive unit comprises:
a third transistor connected between a ground end and the control end of the output transistor; and
a current-limiting resistor connected in series to the third transistor.

8. A load drive device comprising:
an output transistor connected to one end of an inductive load and through which output current flows to the inductive load by on/off switching;
an overcurrent protection circuit for detecting whether the output current is in an overcurrent state,
a first drive unit for switching on/off the output transistor in accordance with an input signal during normal operation; and
a second drive unit for switching off the output transistor more slowly than the first drive unit during overcurrent protection operation.

9. The load drive device of claim 8, further comprising:
a mask time generation circuit for instructing the first and second drive units to carry out overcurrent protection operation when an overcurrent state of the output current has continued for a predetermined mask time.

10. The load drive device of claim 9, further comprising:
an input terminal to which the input signal is provided;
an input signal breaker for providing the input signal to the first drive unit during normal operation, and cutting off the input signal to the first drive unit without waiting for the mask time to elapse when an overcurrent state of the output current has been detected, the input signal breaker being connected to the input terminal.

11. The load drive device of claim 10, wherein the load drive device has a plurality of the inductive loads connected thereto, and has one each of the first drive unit, the second drive unit, the overcurrent protection circuit, and the mask time generation circuit for each of a plurality of load drive lines.

12. The load drive device of claim 10, wherein the load drive device has a plurality of the inductive loads connected thereto; has one each of the first drive unit, the second drive unit, and the overcurrent protection circuit for each of a plurality of load drive lines; and has a single mask time generation circuit provided in common to the plurality of load drive lines, and a logic OR arithmetic unit for generating a logic OR signal of the overcurrent detection signals outputted from the plurality of overcurrent protection circuits and supplying the logic OR signal to the mask time generation circuit and the plurality of input signal breakers.

13. The load drive device of claim 8, further comprising a Schmitt buffer to which the input signal is provided and from which the input signal is transmitted to the first drive unit.

14. The load drive device of claim 8, wherein
the first drive unit comprises:
  a first transistor connected between a power source end and a control end of the output transistor;
  a second transistor connected between a ground end and the control end of the output transistor; and
  a control unit for switching on/off the first and second transistors, and
wherein the second drive unit comprises:
  a third transistor connected between a ground end and the control end of the output transistor; and
  a current-limiting resistor connected in series to the third transistor.

15. The load drive device of claim 10, further comprising a Schmitt buffer inserted between the input terminal and the signal breaker.

16. The load drive device of claim 15, further comprising a resistor inserted between the input terminal and ground potential.

17. A load drive device comprising:
an output terminal connected to one end of an inductive load; and
an output transistor connected to the output terminal and through which output current flows to the inductive load by on/off switching;
an overcurrent protection circuit for detecting whether the output current is in an overcurrent state,
a first drive unit for switching on/off the output transistor in accordance with an input signal during normal operation; and
a second drive unit for switching off the output transistor more slowly than the first drive unit during overcurrent protection operation.

18. The load drive device of claim 17, further comprising:
an input terminal to which the input signal is provided;
an input signal breaker for providing the input signal to the first drive unit during normal operation, and cutting off the input signal to the first drive unit without waiting for the mask time to elapse when an overcurrent state of the output current has been detected, the input signal breaker being connected to the input terminal.

19. The load drive device of claim 18, further comprising:
a connection detection unit to which the input signal and the voltage that appears at the output terminal are provided; and
a detection terminal for providing a signal based on output from the connection detection unit.

* * * * *